United States Patent
Payette

(10) Patent No.: US 7,490,311 B1
(45) Date of Patent: Feb. 10, 2009

(54) RESET MANAGER

(75) Inventor: Benoit Payette, Blainville (CA)

(73) Assignee: Xilinx, Inc., San Jose, CA (US)

( * ) Notice: Subject to any disclaimer, the term of this patent is extended or adjusted under 35 U.S.C. 154(b) by 56 days.

(21) Appl. No.: 10/986,711

(22) Filed: Nov. 12, 2004

(51) Int. Cl.
*G06F 17/50* (2006.01)
*H03K 17/693* (2006.01)

(52) U.S. Cl. ...................................................... 716/16

(58) Field of Classification Search ................ 716/6, 716/16, 3, 19–21
See application file for complete search history.

(56) References Cited

U.S. PATENT DOCUMENTS

| | | | | |
|---|---|---|---|---|
| 6,573,748 | B1* | 6/2003 | Trimberger | 326/38 |
| 2005/0007027 | A1* | 1/2005 | Fryer et al. | 315/169.3 |
| 2005/0062703 | A1* | 3/2005 | Lee et al. | 345/89 |
| 2005/0085948 | A1* | 4/2005 | Herr et al. | 700/258 |

OTHER PUBLICATIONS

Lim, Davin et al., "Two Flows for Partial Reconfiguration: Module Based or Small Bit Manipulators," Application Note XAPP290 (v1.0), May 17, 2002, available from Xilinx, Inc., 2100 Logic Drive, San Jose, California 95124, USA.

* cited by examiner

*Primary Examiner*—Jack Chiang
*Assistant Examiner*—Suresh Memula
(74) *Attorney, Agent, or Firm*—Scott Hewett

(57) ABSTRACT

A reconfigurable module in a programmable logic device ("PLD"), such as a field-programmable gate array ("FPGA"), is reset after reconfiguration by an internal reset signal. The internal reset signal allows other modules in the PLD to remain active while the reconfigurable module is reconfigured and reset. The internal reset signal is generated by a reset manager circuit that optionally resides within the reconfigurable module.

6 Claims, 5 Drawing Sheets

RESET MANAGER

FIELD OF THE INVENTION

This invention relates generally to techniques for resetting configurable logic blocks in programmable logic devices.

BACKGROUND OF THE INVENTION

Programmable logic devices (PLDs) are a well-known type of integrated circuit that can be programmed to perform specified logic functions. One type of PLD, the field programmable gate array (FPGA), typically includes an array of programmable tiles. These programmable tiles can include, for example, input/output blocks (IOBs), configurable logic blocks (CLBs), dedicated random access memory blocks (BRAM), multipliers, digital signal processing blocks (DSPs), processors, clock managers, delay lock loops (DLLs), and so forth.

Each programmable tile typically includes both programmable interconnect and programmable logic. The programmable interconnect typically includes a large number of interconnect lines of varying lengths interconnected by programmable interconnect points (PIPs). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device, or CPLD. A CPLD includes two or more "function blocks" connected together and to input/output (I/O) resources by an interconnect switch matrix. Each function block of the CPLD includes a two-level AND/OR structure similar to those used in Programmable Logic Arrays (PLAs) and Programmable Array Logic (PAL) devices. In some CPLDs, configuration data is stored on-chip in non-volatile memory. In other CPLDs, configuration data is stored on-chip in non-volatile memory, then downloaded to volatile memory as part of an initial configuration sequence.

For all of these programmable logic devices (PLDs), the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other PLDs are programmed by applying a processing layer, such as a metal layer, that programmably interconnects the various elements on the device. These PLDs are known as mask programmable devices. PLDs can also be implemented in other ways, for example, using fuse or antifuse technology. The terms "PLD" and "programmable logic device" include, but are not limited to, these exemplary devices, as well as encompassing devices that are only partially programmable.

Before programming a PLD with data bits, the PLD is typically reset, which sets the device to a known initial condition. For example, a PLD is reset when it is first powered on to initialize the logic, memory, and routing to a known state, and then the data bits are loaded into the PLD to set the logic and any optionally routing and memory. Typically, several modules (i.e. portions of the PLD configured to run an application) are loaded into the PLD. In some instances, it is desirable to reconfigure one module, while not reconfiguring the other modules. One way to do this would be to halt operation of the entire PLD, reset the PLD, and load in a complete set of instructions for all the modules. This is very inefficient and disrupts operation of the modules that are not being reconfigured ("fixed modules").

Another approach is to allow the fixed modules to continue running while only reconfigured modules are loaded. Reconfiguring a selected module while allowing the remainder of the PLD to continue operating is called "active partial reconfiguration." However, whenever a reconfigured module has completed loading, the previous state of the flip-flops are preserved and may not contain the proper state to correctly operate the reconfigured module.

Additionally, conventional partial active reconfiguration methods typically need to detect when the reconfigured module is available for use, and many clock cycles of the PLD could be wasted to poll the state of the reconfigured module to determine if it is active or not, and whether it needs to be reset. Once the state is detected, the module is reset, if needed. However, the reconfigured module could have been inactive for some time, resulting in a loss of processing power. Even worse, the reconfigured module could have executed erroneous commands because the initial state of the module was unknown before the reset.

Therefore, it is desirable to reset a reconfigurable module of a programmable logic device while other modules of the programmable logic device remain active.

SUMMARY OF THE INVENTION

A reconfigurable module in a programmable logic device ("PLD"), such as a field-programmable gate array ("FPGA"), is reset after reconfiguration of the reconfigurable module by an internal reset signal. The internal reset signal allows other modules in the PLD to remain active while the reconfigurable module is reconfigured and reset. The internal reset signal is generated by a reset manager circuit that optionally resides within the reconfigurable module.

DETAILED DESCRIPTION OF THE DRAWINGS

Figure 1:
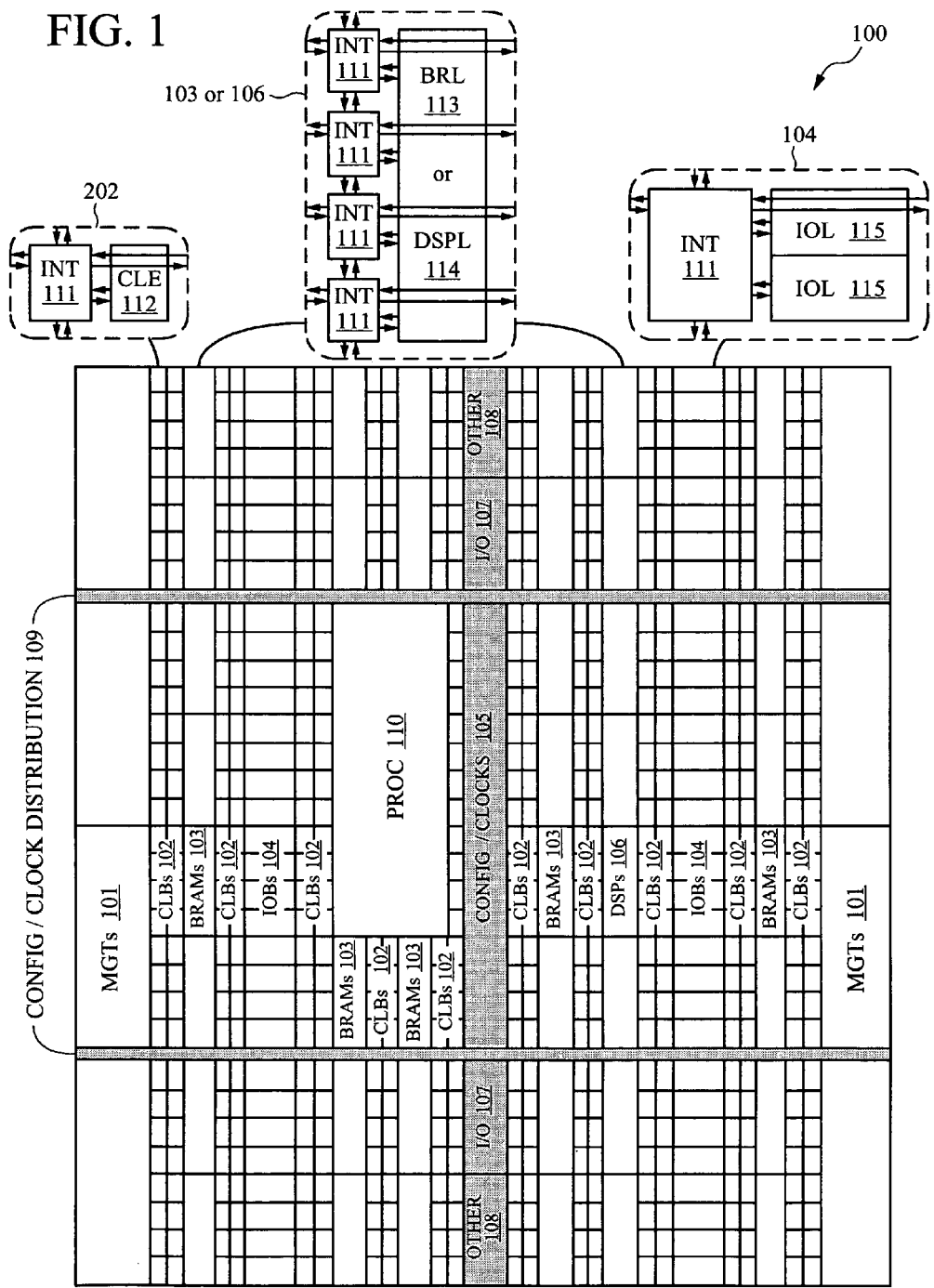
FIG. 1 illustrates an FPGA architecture suitable for implementing embodiments of the invention.

Advanced FPGAs can include several different types of programmable logic blocks in the array. For example, FIG. 1 illustrates an FPGA architecture 100 suitable for implementing embodiments of the invention. Alternative embodiments of the invention are implemented in other devices. The FPGA architecture includes a large number of different programmable tiles including multi-gigabit transceivers (MGTs 101), configurable logic blocks (CLBs 102), random access memory blocks (BRAMs 103), input/output blocks (IOBs 104), configuration and clocking logic (CONFIG/CLOCKS 105), digital signal processing blocks (DSPs 106), specialized input/output blocks (I/O 107) (e.g., configuration ports and clock ports), and other programmable logic 108 such as digital clock managers, analog-to-digital converters, system monitoring logic, and so forth. Some FPGAs also include dedicated processor blocks (PROC 110).

In some FPGAs, each programmable tile includes a programmable interconnect element (INT 111) having standardized connections to and from a corresponding interconnect element in each adjacent tile. Therefore, the programmable interconnect elements taken together implement the programmable interconnect structure for the illustrated FPGA. The programmable interconnect element (INT 111) also includes the connections to and from the programmable logic element within the same tile, as shown by the examples included at the top of FIG. 1.

For example, a CLB 102 can include a configurable logic element (CLE 112) that can be programmed to implement user logic plus a single programmable interconnect element (INT 111). A BRAM 103 can include a BRAM logic element (BRL 113) in addition to one or more programmable interconnect elements. Typically, the number of interconnect elements included in a tile depends on the height of the tile. In the pictured embodiment, a BRAM tile has the same height as four CLBs, but other numbers (e.g., five) can also be used. A DSP tile 106 can include a DSP logic element (DSPL 114) in addition to an appropriate number of programmable interconnect elements. An IOB 104 can include, for example, two instances of an input/output logic element (IOL 115) in addition to one instance of the programmable interconnect element (INT 111). As will be clear to those of skill in the art, the actual I/O pads connected, for example, to the I/O logic element 115 are manufactured using metal layered above the various illustrated logic blocks, and typically are not confined to the area of the input/output logic element 115.

In the pictured embodiment, a columnar area near the center of the die (shown shaded in FIG. 1) is used for configuration, clock, and other control logic. Horizontal areas 109 extending from this column are used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, the processor block PROC 210 shown in FIG. 1 spans several columns of CLBs and BRAMs.

Note that FIG. 1 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 1 are purely exemplary. For example, in an actual FPGA more than one adjacent column of CLBs is typically included wherever the CLBs appear, to facilitate the efficient implementation of user logic. Alternative FPGAs have more or fewer functional blocks.

Figure 2A:
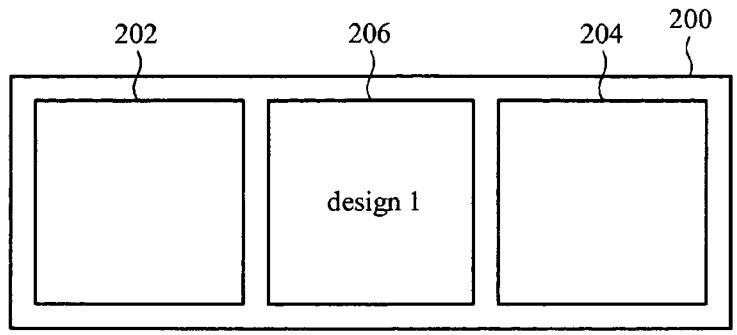
FIG. 2A is a diagram of a portion of an FPGA with two fixed modules and a prior art reconfigurable module.

FIG. 2A is a diagram of a portion of an FPGA 200 with two fixed modules 202, 204 (i.e. fixed logic) and a prior art reconfigurable module 206 (i.e. logic that will be reconfigured while the FPGA 200 is operating). The term "fixed" means that those modules are not reconfigured when the resettable module 206 is reconfigured. The fixed modules are CLBs or embedded modules, for example. In some embodiments, the fixed modules 202, 204 and the reconfigurable module 206 are all CLBs and the fixed modules are optionally capable of being reset and reconfigured during other partial reconfiguration sequences.

The reconfigurable module 206 is in a first logic state. That is, it has been configured to perform logic according to a first set of data bits that has been loaded into the reconfigurable module 206. The data bits are loaded using an internal (to the FPGA 200) processor (not shown), an external processor (not shown), a finite-state machine ("FSM") (not shown), from a look-up table ("LUT") (not shown), from internal or external RAM or ROM (not shown), and/or an external reset sequencing memory (not shown), for example.

Figure 2B:
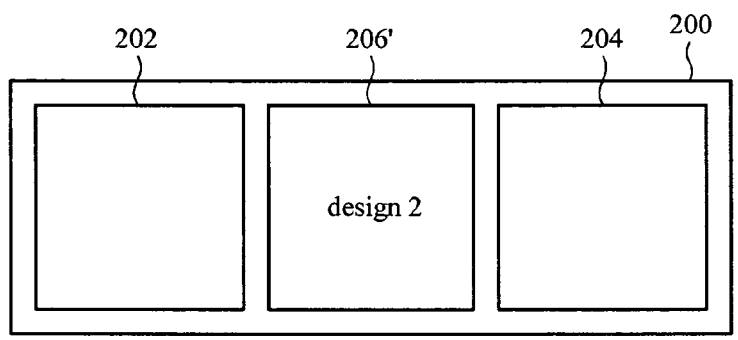
FIG. 2B is a diagram of the portion of the FPGA of FIG. 2A with a reconfigured reconfigurable module.

FIG. 2B is a diagram of the portion of the FPGA 200 of FIG. 2A with a reconfigured reconfigurable module 206'. The reconfigurable module 206' has been loaded to perform a different logic function than the module 206 of FIG. 2A. For example, the module 206 might be configured to perform a first function, i.e., design 1, while the reconfigured module 206' is configured to perform a second function, i.e., design 2.

In one conventional partial active reconfiguration technique, the global internal reset signal (e.g. the AGHIGH signal in the VIRTEX™ family of devices) is disabled to allow the fixed modules 202, 204 to run normally. However, this results in the newly loaded (reconfigured) module 206' keeping its flip-flop states from the prior module configuration. This can cause problems when critical logic is expected to be in an initial state when the reconfigured module becomes active. For example, if reconfigured module becomes a FSM without being reset, two states of the FSM might be enabled. Generally, a different function than what was intended might occur after reconfiguration.

Figure 3A:
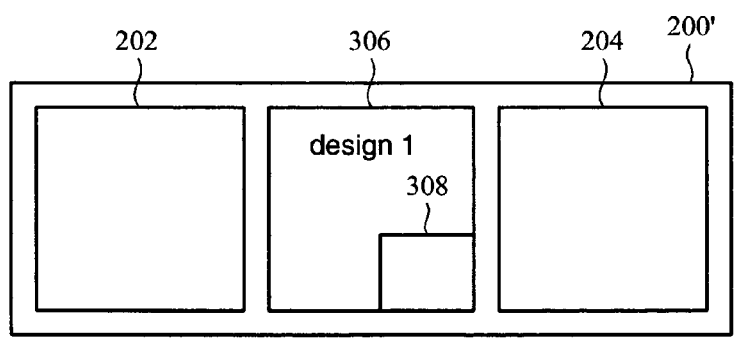
FIG. 3A is a diagram of a portion of an FPGA with a reset manager circuit resident in a reconfigurable module according to an embodiment of the invention.

FIG. 3A is a diagram of a portion of an FPGA 200' with a reset manager circuit 308 resident in a reconfigurable module 306 according to an embodiment of the invention. The reconfigurable module 306 is adjacent to fixed modules 202, 204. Alternatively, the other modules are also reconfigurable modules and have associated reset manager circuits (not shown). Once a functional design, e.g., design 1, is first loaded into the FPGA 200' and is working normally, the reset manager circuit 308 is present but is disabled. In other words, once the FPGA has been configured, the reset manager will perform its function and generate an internal reset signal when the reconfigurable module is loaded. The operation of the reset manager circuit is transparent to the normal operation of the FPGA. When a new functional design (e.g., design 2) is loaded into the reconfigurable module 306', the reset manager is enabled and is ready to create an internal module reset pulse (see FIG. 3B).

In one embodiment, the reset manager circuit is implemented as a slice built to monitor the state of a memory cell (i.e. a RAM cell) and to create a reset pulse if a new module has been loaded. The internal reset loads a value (e.g. a "1") into the memory cell when a new functional design in loaded into the reconfigurable module. The reset manager circuit compares a value stored in the memory cell to a reference value (e.g. a reference "0"). Upon reconfiguration, since the memory cell is set from the bitstream of the newly loaded functional design, a pulse will be generated because the logic value in the memory cell is different than the logic value in the reference cell. Once the pulse is completed, the memory cell is set to the opposite value (e.g. to "0") to disable the reset manager circuit until a new functional design is loaded into the reconfigurable module. Of course, different logic values could be used for each condition, and the reset pulse could be generated when the memory cell contains the same value as the reference cell, for example, and disabling of the reset manager circuit occurs when the reference and memory cells have different values.

Resetting the memory cell to "0" to disable the reset manager circuit avoids multiple internal reset signals from being generated after loading the new functional design. This allows the module to operate without being constantly reset, and makes the operation of the reset manager circuit transparent to both the reconfigurable module, as well as to the active modules of the PLD.

The initial memory cell state can be set with a generic initialization that sets the memory cell to a logical "1". For example, a value of "0" in the memory cell disables reconfiguration, and "1" in the memory cell enables reconfiguration, or vice versa. Optionally, each reset manager circuit is customized for its associated module.

The operation of resetting the module for reconfiguration is automatic and does not require external control. However, in alternative embodiments the reset manager circuit resides outside of the module that it is associated with, and in some embodiments resides outside of the FPGA or other PLD, such as in a processor, FSM, or dedicated reset circuit. However, external reset managers typically require additional clock cycles to poll the state of the reconfigurable module to determine if it is active and whether it needs to be reset. Therefore, a reset manager internal to the reconfigurable module is particularly desirable. A reset manager can be implemented using only a small amount of resources, and is simple to add to many existing designs of PLDs. The reset manager basically provides a module reset signal without interfering with global reset operations.

In some embodiments, individual reset manager circuits are associated with each reconfigurable module and are coupled with the external reset to create a local reset in the reconfigurable modules. The reset manager circuit may have an optimal location in the PLD for best behavior of the registers and logic, for example. This could be implemented with relative location circuits ("rlocs"), for example. Riocs is a way to insure that the reset manager circuit is implemented in the same location each time a new functional design is loaded into the reconfigurable module. Not all PLDs capable of implementing embodiments of the invention have the rloc feature. In some embodiments, a reset manager circuit is embedded into the PLD. In other embodiments, other techniques are used to insure that the reset manager circuit is implemented in the same location with any functional design that is loaded into the reconfigurable module. In yet other embodiments, the physical location of the reset manager circuit does not necessarily lie at the same physical location for each functional design that is loaded into the reconfigurable memory cell.

Figure 3B:
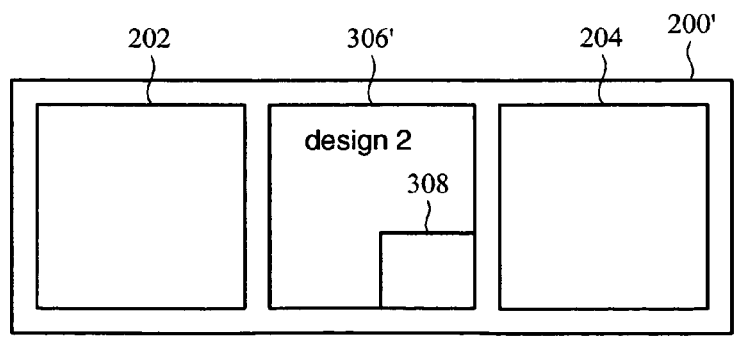
FIG. 3B is the portion of the FPGA shown in FIG. 3A after the reconfigurable module has been reconfigured with a new design.

FIG. 3B is the portion of the FPGA 200' shown in FIG. 3A after the reconfigurable module 306' has been reconfigured with a new design (i.e. new logic). The new design (e.g., design 2) enables the reset manager 308 to create a reset pulse.

Figure 4:
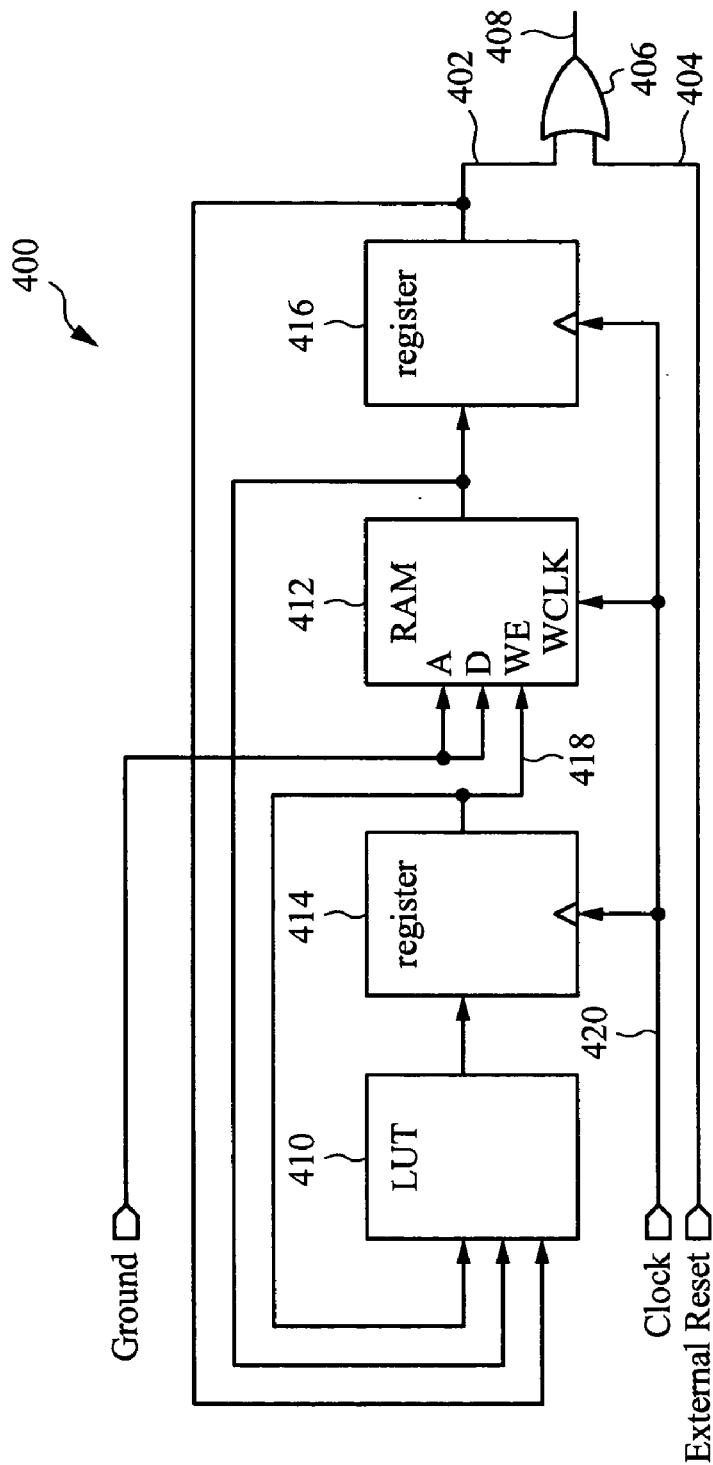
FIG. 4 is a circuit diagram of a reset manager circuit according to an embodiment of the present invention.

FIG. 4 is a circuit diagram of a reset manager circuit 400 according to an embodiment of the present invention. The reset manager circuit 400 produces an internal reset signal 402. The internal reset signal 402 and an external reset signal 404, such as a global reset signal, are provided to an optional OR gate 406. If either an internal reset signal 402 or an external reset signal 404 is present at the OR gate 406, a module reset signal 408 is generated. The module reset signal 408 is provided to a reconfigurable module (see FIGS. 3A, 3B, ref. nums. 306, 306'). An LUT 410 observes the state of a reference memory cell (RAM) 412, load FD register 414, and reset FD register 416 to determine the next legal state of the load FD register 414. "FD" stands for flip-flop D, which passes data on the transition edge of the clock 420. In another embodiment the OR gate 406 is either absent or replaced by some other predetermined application circuit.

The LUT 410 controls the write enable signal 418 of the reference memory cell 412, and this write enable signal will load a zero into the reference memory cell 412 to disable the reset pulse function. The LUT can also check the value in the reference memory cell 412 to insure that it was reset to disable the reset manager circuit after the reconfigurable module was reconfigured and reset. In a particular embodiment, the function of the LUT is:

LoadLUT=(NOT LoadFD) AND Reference AND Reset FD

Whenever a new functional design is loaded into a reconfigurable module of the FPGA, the reset manager reference 412 is set to "1". When the "1" is detected, a pulse on the internal reset signal 402 is generated, which resets the resettable module (ref. num. 306, FIG. 3A) and returns the reference 412 to "0." Thus, whenever a new functional design is loaded into the reconfigurable module of the FPGA (see FIG. 3B, ref. num. 200'), the internal reset circuit will generate a pulse to make sure the newly configured module is started in a known state. If an external reset signal is applied to the reconfigured module, it is coupled through the OR gate 406, and the reconfigured module performs normally.

Figure 5:
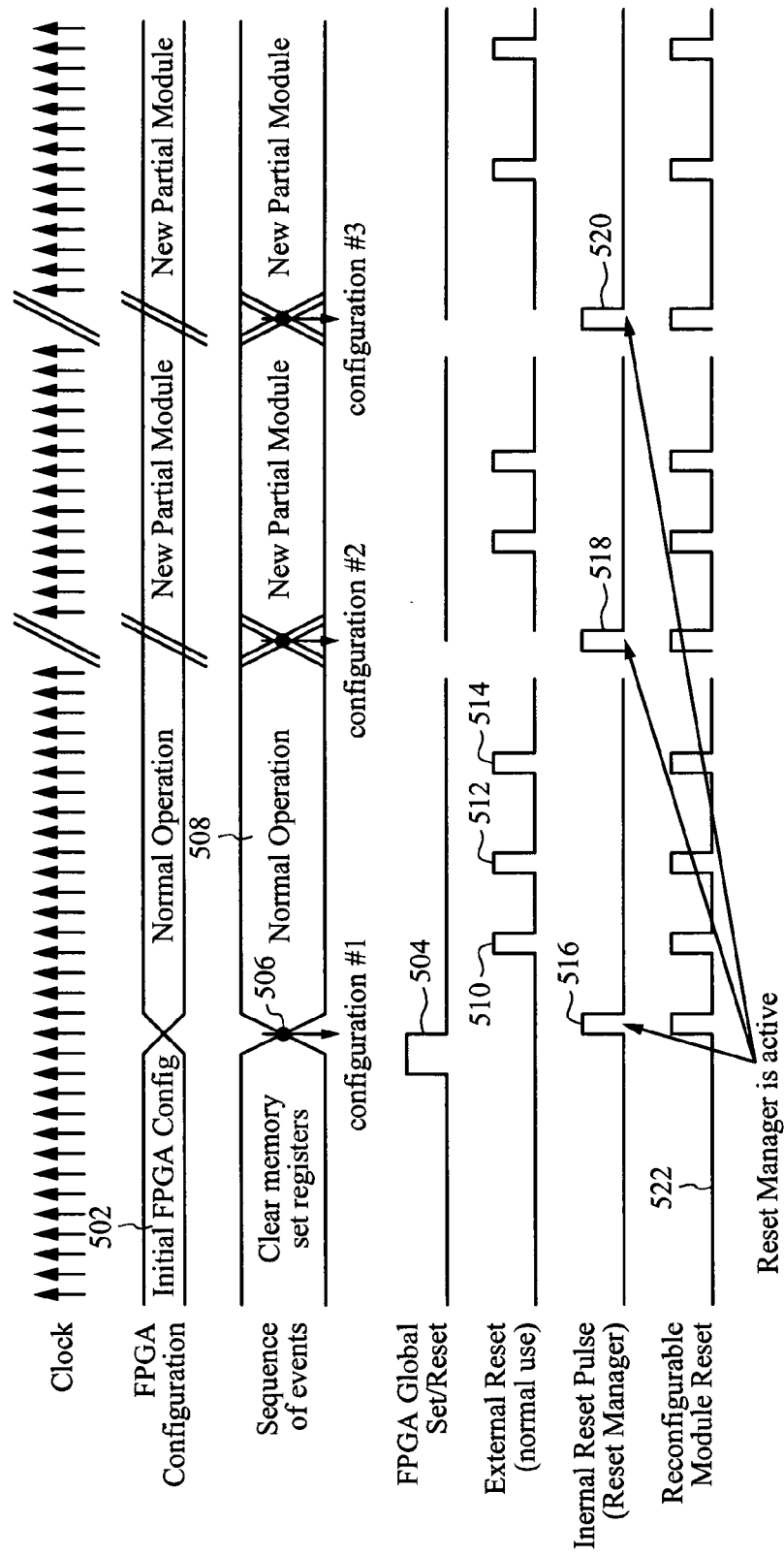
FIG. 5 is a timing diagram illustrating reset manager operation according to an embodiment of the invention.

FIG. 5 is a timing diagram 500 illustrating reset manager operation according to an embodiment of the invention. An FPGA is initially configured 502. When a global reset pulse 504 is received, memory is cleared and registers are set 506. The FPGA operates normally 508, during which period a number of external reset pulses 510, 512, 514 are provided to a reconfigurable module of the FPGA. For example, if the reconfigurable module is configured as an ADDER, the external pulses might be provided before or after each ADD operation.

Additionally, an internal reset pulse 516 is generated by the reset manager when the first design (e.g. an ADDER configuration) is loaded. Additional internal reset pulses 518, 520 are generated during operation as additional designs are loaded into the reconfigurable module. The reconfigurable module reset signal 522 is the sum of the internal and external reset pulses. Loading a design into the reconfigurable module activates the reset manager. When the design is loaded, an internal reset pulse is generated, resetting the module and returning the reset manager to an inactive state.

Figure 6:
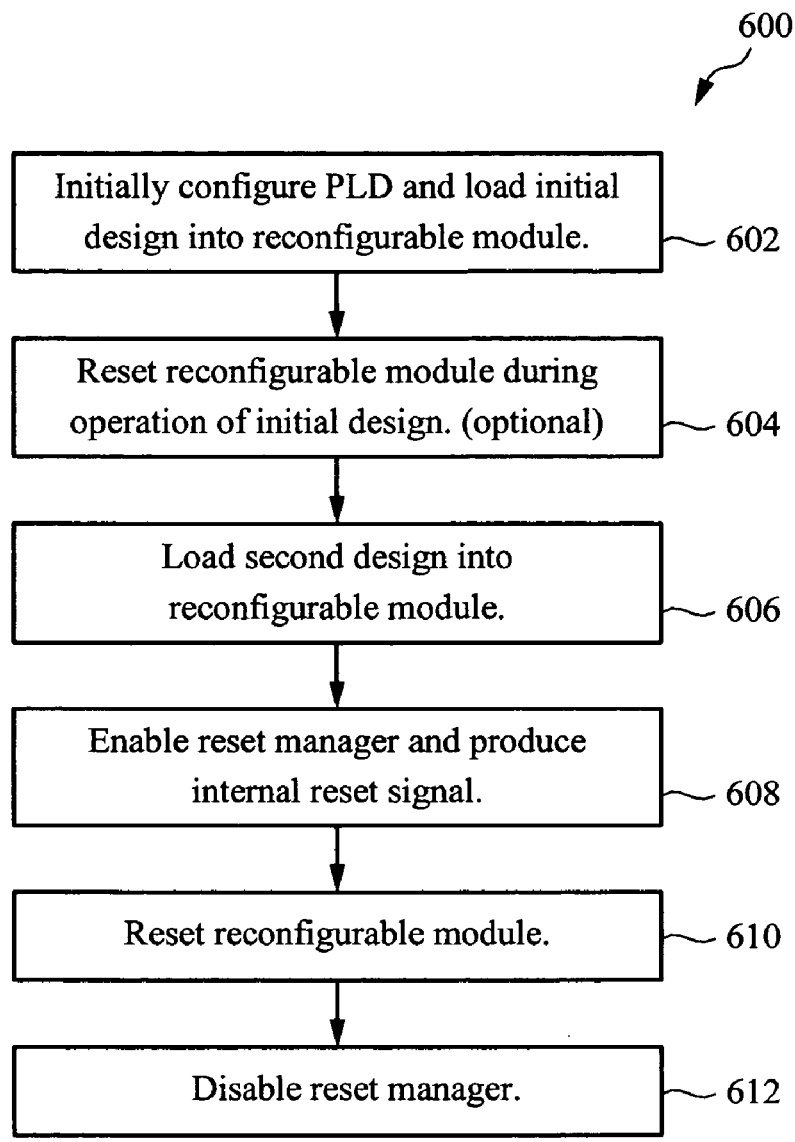
FIG. 6 is a flow chart of a method of partial active reconfiguration of a PLD according to an embodiment of the present invention.

FIG. 6 is a flow chart of a method 600 of partial active reconfiguration of a PLD according to an embodiment of the present invention. A PLD is initially configured, resetting the PLD and loading a design into a reconfigurable module of the PLD (step 602). The reconfigurable module of the PLD optionally receives an external (to the reconfigurable module) reset signal (step 604) during operation of the design to reset the module. A second design is loaded into the reconfigurable module (step 606), enabling a reset manager circuit and producing an internal reset signal (step 608). The internal reset signal resets the reconfigurable module (step 610) without interrupting operation of other (active) modules running in the FPGA. After the reconfigurable module is reset, the reset manager circuit is disabled (step 612), which allows the newly reconfigured module to operate using external reset signals. In a particular embodiment, the reset manager is disabled by loading a selected digital value (e.g. "0") into a reference memory cell.

While the present invention has been described in connection with specific embodiments, variations of these embodiments will be obvious to those of ordinary skill in the art. For example, a PLD may have many reconfigurable modules with reset manager circuits within the module, and/or with reset manager circuits located outside the module but on the PLD, and/or with reset manager circuits external to the PLD. Therefore, the spirit and scope of the appended claims should not be limited to the foregoing description.

The invention claimed is:

1. A programmable logic device comprising:
   a plurality of modules positioned in the programmable logic device;
   a reconfigurable module of the plurality of modules, the reconfigurable module having a first functional design;
   a reset manager circuit, comprising a reference memory cell, and generating an internal reset signal provided to the reconfigurable module when a second functional design is loaded into the reconfigurable module such that the second functional design has a known initial state, wherein the reset manager circuit is enabled when a first value is present in the reference memory cell, and is disabled when a second value is present in the reference memory cell;
   a look-up table coupled to the reference memory cell;
   a first register disposed between the look-up table and the reference memory cell; and
   a second register disposed between the reference memory cell and an OR gate, wherein the look-up table is coupled to the first register and to the second register;
   wherein the reset manager circuit is incorporated in the programmable logic device; and
   wherein the internal reset signal is enabled to affect only the reconfigurable module of the plurality of modules and to allow another reconfigurable module of the plurality of modules to remain unaffected.

2. The programmable logic device of claim 1 wherein the reset manager circuit is incorporated in a location of the programmable logic device after the first functional design is loaded into the reconfigurable module, and is incorporated into the location after the second functional design is loaded into the reconfigurable module.

3. The programmable logic device of claim 1 wherein the reset manager circuit is implemented inside the reconfigurable module.

4. The programmable logic device of claim 3 wherein the reset manager circuit is implemented in a location of the reconfigurable module after the first functional design is loaded, and is implemented in the location of the reconfigurable module after the second functional design is loaded.

5. The programmable logic device of claim 1 further comprising an OR gate coupled to the internal reset signal and to an external reset signal and producing a module reset signal when one of the internal reset signal or the external reset signal is asserted.

6. The programmable logic device of claim 1 wherein the programmable logic device comprises a field-programmable gate array.

* * * * *